United States Patent [19]
Levitt et al.

[11] Patent Number: 5,682,238
[45] Date of Patent: Oct. 28, 1997

[54] MULTIPLE, PARALLEL, SPATIAL MEASUREMENT OF ELECTRICAL PHASE

[75] Inventors: Hal L. Levitt, Baltimore; Anthony Y. Tse, Greenbelt, both of Md.

[73] Assignee: The United States of America as represented by the Secretary of the Navy, Washington, D.C.

[21] Appl. No.: 489,663

[22] Filed: Jun. 12, 1995

[51] Int. Cl.$^6$ ..................................................... G01B 9/02
[52] U.S. Cl. .................................. 356/345; 324/76.37
[58] Field of Search .................................. 356/345, 346; 324/76.36, 76.37; 342/192; 359/191

[56] References Cited

U.S. PATENT DOCUMENTS

| | | |
|---|---|---|
| 4,225,938 | 9/1980 | Turpin . |
| 4,634,230 | 1/1987 | Spezio ..................................... 359/191 |
| 4,639,139 | 1/1987 | Wyant et al. . |
| 4,644,267 | 2/1987 | Tsui et al. ............................... 324/77 K |
| 4,909,627 | 3/1990 | Brousseau ............................... 356/349 |
| 5,139,336 | 8/1992 | See et al. . |
| 5,327,142 | 7/1994 | Tsui et al. ................................ 342/192 |

OTHER PUBLICATIONS

H. Levitt, Precision Direction Finding Receiver, 1994 Annual ARPA/MTO Optoelectronics Program Review, Monterey, CA, Jun. 13–17, 1994, Presented in Session 14: Tops/Signal Proc., Presentation #3 (Jun. 17, 1994), 13 pages (Hardcopy available on Jun. 13, 1994).

Hal L. Levitt et al., Superresolution Precision Direction–Finding Techniques and Measurements, SPIE Aerospace Sensing & Control Symposium, Orlando, Florida, Technical Conference #2489, Apr. 18, 1995, 12 pages.

*Primary Examiner*—Samuel A. Turner
*Attorney, Agent, or Firm*—Thomas F. McDonnell; George Jameson

[57] ABSTRACT

A signal processing apparatus for providing accurate electrical phase difference measurement of multiple concurrent signal inputs is disclosed. Phase measurement of an individual signal input is accomplished utilizing an efficient spatial sampling scheme. In operation, measurement and reference wideband RF inputs, differing primarily in phase over frequency, are respectively applied to two RF Channelizer components. Each Channelizer separates the composite input bandwidth into multiple time-coincident frequency output channels. Corresponding pairs of output channels then phase modulate a common independent carrier which propagates to the detection plane of a photodetector array forming a spatial interference pattern along one axis for each frequency channel number. A preferred detector element scaling relative to the interference pattern affords efficient phase difference measurement incorporating three detector elements at each frequency channel. Conversion of the preferred three detector element intensity values to relative signal phase is accomplished with an algorithm.

24 Claims, 5 Drawing Sheets

MULTIPLE, PARALLEL, SPATIAL MEASUREMENT OF ELECTRICAL PHASE

BACKGROUND OF THE INVENTION

1. Field of the Invention

The present invention relates to electrical phase measurements and particularly to a signal processing apparatus for providing accurate electrical phase difference measurement of multiple signal inputs concurrently.

2. Description of the Related Art

Electrical phase detection and/or measurement is a prerequisite requirement for numerous signal processing, communication, and signal measurement systems in use today and in the foreseeable future. Many such systems require and utilize multiple parallel input channels for concurrent transduction and conversion of received signals for the purpose of extracting relative phase parameters as a function of time for each input channel. Two current day examples are satellite (and terrestrial) communications systems utilizing multiple phase modulated radio frequency (RF) channels and, single or multiple channel RF interferometers for accurate positional or angular bearing measurement in geolocation or general radio direction finding applications.

Present approaches include multiple individual phase measurement devices (operated in parallel), for which the measured phase accuracy of such devices is generally more sensitive to input signal strength variations. For example, most RF phase detectors in use today are designed to operate within a limited input signal dynamic range, typically in the detector saturation region, and as such are essentially confined to single signal operation at a given instant of time. Multiple time and frequency coincident input signals tend to mutually interfere such that the composite resultant phase detector output is distorted or incorrect.

Current optical phase interferometers such as the Mach-Zehnder configuration provide precise distance or phase difference measurement either by counting interference fringes or by interference pattern intensity variation measurements using a single photodetector element. Phase differences are injected to modulate one of the two optical paths typically by a change of path length or by optical phase moduation device. Optical intensity at the photodetecting element must be calibrated (or referenced) to one or more known input phase conditions to determine the signal modulation index amplitude and initial phase offset, and image plane optical intensity offset measured separately to correctly extract phase differences. Additionally, the range of operational signal levels are constrained by the use of signal strength as the only measurement variable. The additional requirement to measure optical modulation index, intensity offset, and the time sequential nature of the measurement further complicates use of optical interferometers for phase measurement, especially in the case where incident signal strength is a uncontrolled dynamic variable.

Typical coherent signal processing requires relatively complex and expensive processing hardware per channel to operate at intermediate frequencies (IF). A typical coherent approach requires a carrier mixing and filtering operation to convert to an corresponding IF signal which must then be time-domain processed to measure phase.

SUMMARY OF THE INVENTION

It is therefore an object of the invention to provide a signal processing apparatus which performs phase measurement by spatial sampling.

Another object of the invention is to provide a signal processing apparatus for providing accurate electrical phase difference measurement of multiple signal inputs concurrently.

Another object of the invention is to provide a signal processing apparatus which can provide phase measurement of an individual signal input by utilizing an efficient three-point spatial sampling technique.

A further object of this invention is to measure relative electrical phase of multiple input radio frequency signals concurrently, wherein signals are assumed independent of each other in both phase and electrical amplitude and differ in frequency.

These and other objects of this invention are achieved by providing a signal processing apparatus for providing accurate electrical phase difference measurement of multiple signal inputs concurrently. In operation, measurement and reference wideband RF inputs, differing primarily in phase over frequency, are respectively applied to two RF Channelizer components. Each Channelizer separates the composite input bandwidth into multiple time-coincident frequency output channels. Corresponding pairs of output channels then phase modulate a common independent carrier which propagates to the detection plane of a photodetector array forming a spatial interference pattern along one axis for each frequency channel number. A preferred detector element scaling relative to the interference pattern affords efficient phase difference measurement incorporating three intensity-sensing detector elements at each frequency channel. Conversion of the resulting amplitudes from the preferred three detector elements to relative signal phase is accomplished with an algorithm. Phase measurement of an individual signal input is accomplished utilizing an efficient spatial sampling scheme.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding parts throughout the several views and wherein.

DETAILED DESCRIPTION OF THE PREFERRED EMBODIMENTS

Figure 1:
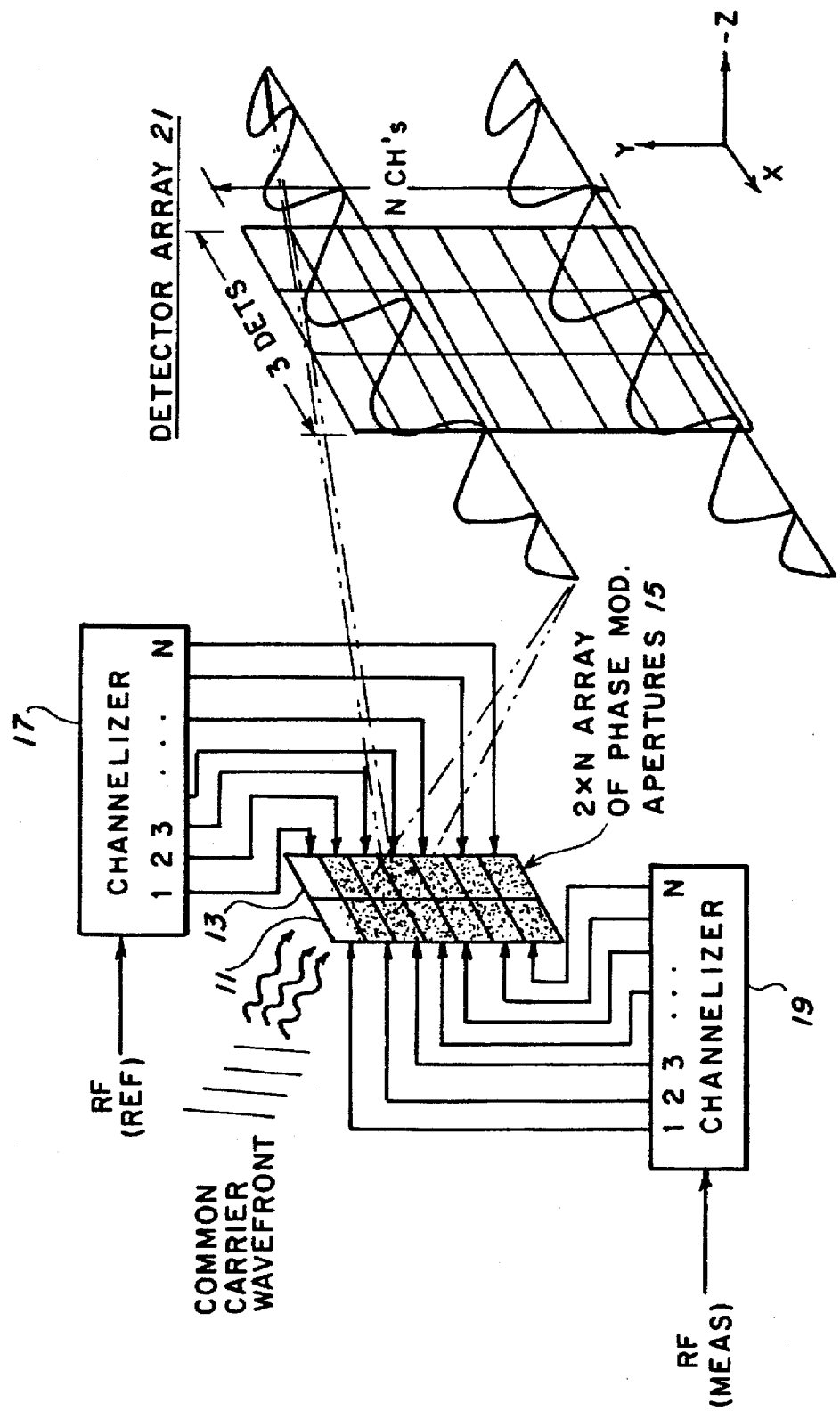
FIG. 1 illustrates a generalized schematic block diagram of the multiple parallel phase measurement apparatus of the invention.

Referring now to the drawings, FIG. 1 illustrates a generalized schematic block diagram of the multiple parallel phase measurement apparatus of the invention for providing accurate electrical phase difference measurement of multiple signal inputs concurrently.

For purposes of this discussion of the specification, a common carrier wavefront will be assumed to be a common optical carrier and input signals will be assumed to be single or composite radio frequency (RF) input signals received at different locations of the apparatus by, for example, two dipole antennas on a phased array antenna. However, it should be realized that the input signals may be sound, heat, light, electrical voltage, or any measureable quantity which may be modulated onto a common carrier at multiple differing frequency offsets. Although an optical carrier (acousto-optic channelization) was used in the preferred embodiment of FIG. 2 (to be discussed), the common carrier may also be represented in other forms (i.e. radio waves) or frequency spectral ranges as well. Thus, for example, RF applications may utilize microwave or millimeter bands, or optical applications operating at infrared or ultraviolet wavelengths.

In the operation of the apparatus of FIG. 1, a common carrier wavefront is projected through a split aperture comprised of two columns 11 and 13 of phase modulator apertures, which together form a 2×N array of phase modulator apertures 15.

A channelizer or RF channelizer circuit 17 is responsive to an input reference (REF) composite RF signal (which contains within a composite RF bandwidth individual RF signals independent of each other in frequency, phase and electrical amplitude) for separating the input composite RF bandwidth into multiple time-concurrent frequency output channels. In other words, the reference composite signal includes a composite of reference phase signals at each frequency within the composite RF bandwidth.

At the same time a channelizer or RF channelizer circuit 19 is responsive to an input measurand (MEAS) composite RF signal (which contains within the composite RF bandwidth individual RF signals independent of each other in frequency, phase and electrical amplitude) for separating the input composite input RF bandwidth into multiple time-concurrent frequency output channels. (The term "measurand" means "that which is to be measured".) In other words, the measurand composite signal includes a composite of phase signals for which relative phase is to be measured at each frequency within the composite RF bandwidth. Thus, each of the channelizers 17 and 19 frequency-segment or sort-select the various frequencies within the composite RF bandwidth into fixed channel widths or bins in frequency which are numbered 1 through N.

It should be noted at this time that both of the reference and measurand composite signals contain the same wideband frequency range inputs, and that each signal frequency in the reference composite signal applied to the channelizer 17 is also concurrently provided in the measureand composite signal that is applied to the channelizer 19. However, there is a phase difference between corresponding frequency components applied to the channelizers 17 and 19.

Corresponding frequency output channels of each of the channelizers 17 and 19 then phase modulate (and optionally amplitude modulate) the common independent carrier signal and exit through the 2×N array of phase modulator apertures 15. Upon exit from each pair of apertures corresponding to a particular frequency channel in the phase modulator apertures 15, the modulated carriers propagate and combine spatially, resulting in a two beam spatial phase interference pattern, as measured by intensity, projecting onto a corresponding row of a detector array 21.

One axis (indicated in FIG. 1 as the Y-axis) of the detector array 21 corresponds to frequency channel number, while the orthogonal axis (indicated in FIG. 1 as the X-axis) corresponds to relative signal phase (and amplitude) information in spatial form as a sinusoidal intensity pattern. The number of detection elements is chosen as three (in the minimal case), with a preferred element separation or pitch corresponding to substantially ninety degrees phase. The number of implemented detector elements is chosen to reduce the total quantity of sampling elements, allow for required intensity offset correction, and to maximize signal energy utilization. A detector element sensing region width narrower than the element spacing will also provide the desired phase extraction function with proportionally lower energy utilization as long as the spacing period or pitch is maintained. Spatial intensity modulation along the phase axis X of the detector array 21 affords simultaneous recovery of relative signal phase and removal of the intensity offset during a single sample time.

Conversion of the preferred three detector element intensity values to relative phase is straightforward and efficient since both in-phase and quadrature information is captured simultaneously. Although not shown in FIG. 1, the intensity values of each group of three detectors shown in FIG. 1 may be converted to a relative phase difference ($\Delta\Phi$) by, for example, a phase extraction processor shown in FIGS. 2 and 2A (to be explained.

Figures 2, 2A:
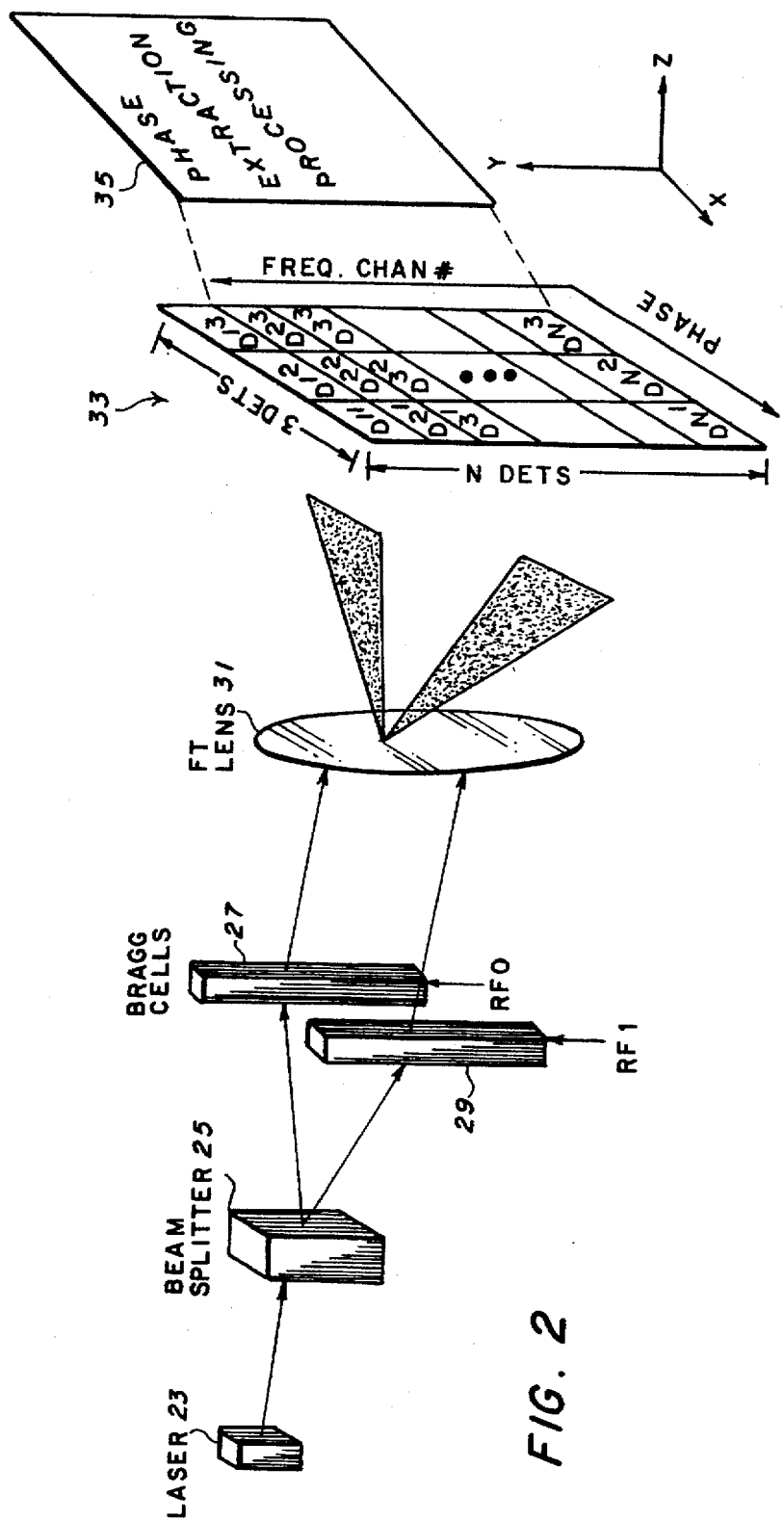
FIGS. 2 and 2A illustrate a schematic block diagrams of a preferred embodiment of the multiple parallel phase measurement apparatus of the invention.

FIG. 2 illustrates a schematic block diagram of a preferred embodiment of the multiple parallel phase measurement apparatus of the invention. The embodiment of FIG. 2 can be called a channelized phase detector (CPD).

In the preferred embodiment of FIG. 2, a monochromatic optical source, such as a laser 23, emits a coherent laser beam or common carrier wavefront. This coherent laser beam is split by a beam splitter 25 into two optical or light beams which illuminate a dual channel acousto-optic Bragg cell comprised of Bragg cells 27 and 29. RF inputs $RF_0$ and $RF_1$ from, for example, a selected antenna pair (not shown) of, for example, a phased array antenna (not shown) are respectively applied to the two Bragg cells 27 and 29. One antenna of the selected antenna pair represents a common reference antenna and the other antenna of the selected antenna pair represents a measurand antenna for which channelized phase difference is to be measured.

Within the respective Bragg cells 27 and 29, each associated illuminating light beam is modulated by the frequency and phase of its associated RF input. For a given input angle of arrival $\theta_A$ associated with an RF signal source, the relative phase difference across the associated antenna element pair is applied to the $RF_0$ and $RF_1$ inputs to the Bragg cells 27 and 29 and is replicated (or modulated) in optical outputs of the Bragg cells 27 and 29. Upon exiting the Bragg cells 27 and 29, the two optical beams therefrom interfere spatially to develop an interference pattern along a phase or X-axis, and are deflected along the orthogonal axis at an angle approximately proportional to the incident RF signal frequency. This optical interference pattern is Fourier-transformed by a Fourier Transform lens 31 and imaged onto an area detector or photodetector array 33.

Thus, the resulting photodetector image intensity modulation pattern is two-dimensional, with phase interference occurring along the X-axis and the RF signal Fourier transform occurring along the Y-dimension or Y-axis, as depicted in FIG. 2.

Three detector elements span the X-axis or phase axis in the phodetector array 33 to sense intensity with preferred interval spacing of ninety degrees each. This configuration serves to minimize the required number of sampling elements, provide for optical intensity offset correction, and to maximize signal energy utilization. Detector element sensing regions narrower than the spacing pitch of ninety degrees will also provide the desired phase extraction function (with lower energy efficiency however) as long as the spacing pitch is maintained at ninety degrees.

In each of the Bragg cells or elements 27 and 29 of FIG. 2, Bragg diffraction of the of the RF modulated optical beams results in deflection of individual frequency components along the frequency channelization axis or Y-axis by an angle approximated by Equation 1.

$$\theta \simeq \lambda \cdot f_S/2nV_S \qquad (1)$$

where:

$\lambda$=optical wavelength, $f_S$=acoustic (RF) frequency, $V_S$=acoustic velocity in Bragg Cell medium, n=optical index of refraction.

Coincidently in time, optical beams projecting from both Bragg cells 27 and 29 at identical deflection angles superimpose resulting in a spatial interference pattern along the phase or X axis, as shown in FIG. 2. The two-beam interference pattern equation applies, as given by Equation 2.

$$E\tau^2 = E_1^2 + E_2^2 + 2E_1^2 E_2^2 \cos(\phi_2 - \phi_1) \qquad (2)$$

where:

$E_1$, $E_2$=Electric Field strength of the two input signals, $\phi_1$, $\phi_2$=Electric phase of the two input signals.

Figure 3:
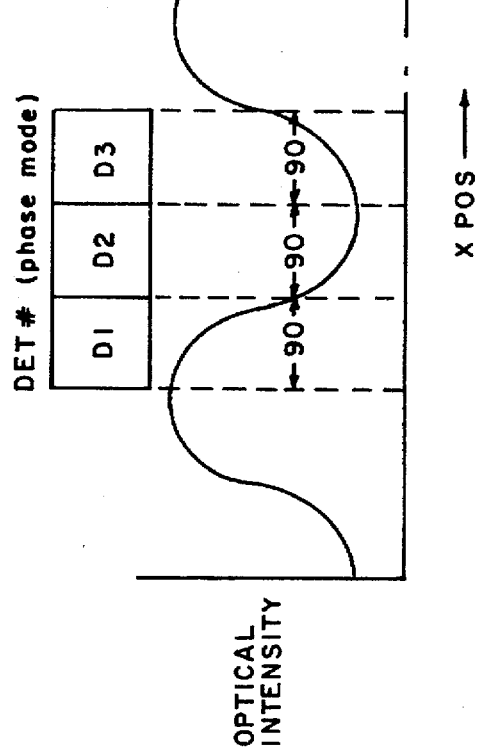
FIG. 3 shows a local view of the two beam spatial interference intensity pattern and its size relative to the detector element size and separation pitch.

FIG. 3 is a graphical plot of optical beam intensity as a function of detector position, size, and pitch. The three photodetector elements D1, D2 and D3 are separated in pitch by a distance corresponding to a span of ninety degrees of the interference pattern period. Note that the detector element (sample) width can vary from near zero to the entire spacing pitch without effect upon the resultant derived phase measurement, except for signal to noise ratio that is related to captured signal energy. Additionally, the derived phase measurement is unaffected by signal amplitude variation over the operating dynamic range.

Figure 4:
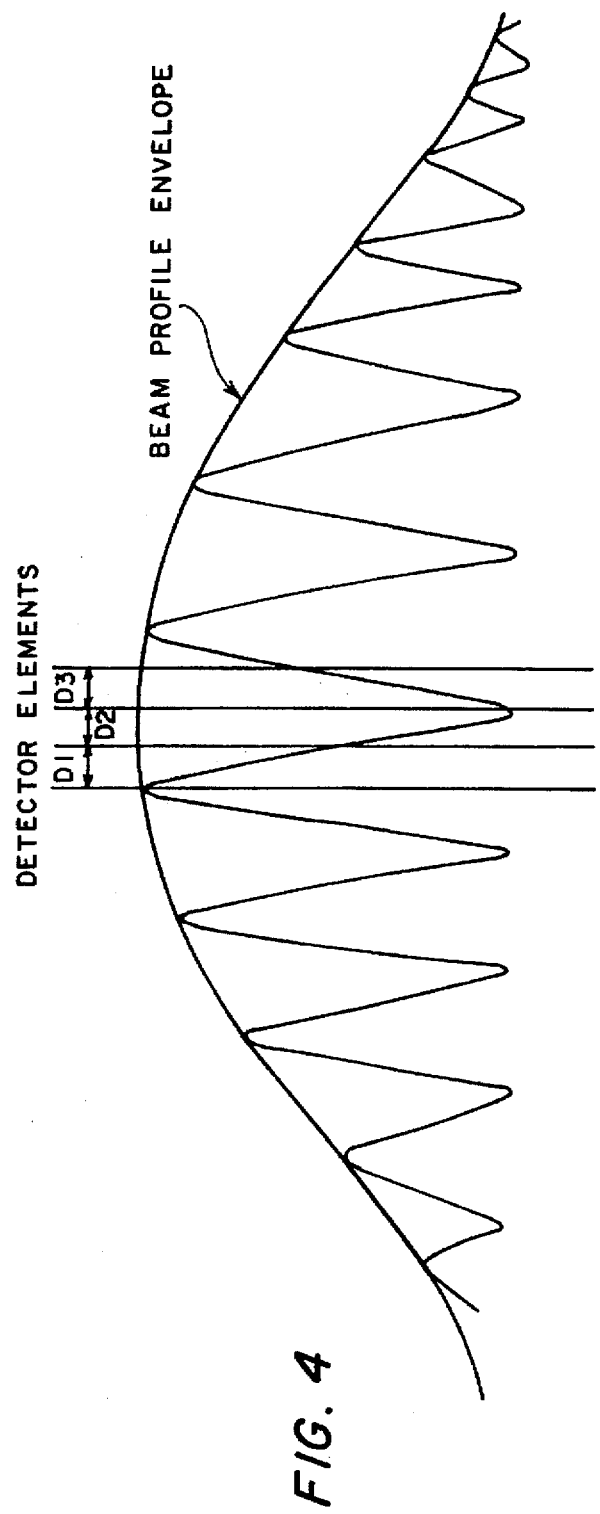
FIG. 4 shows a global view of the two beam spatial interference intensity pattern enclosed within a beam profile envelope typically found in practice.

FIG. 4 represents the interference pattern shape more likely to be found in practice in which the Bragg Cells 27 and 29 of FIG. 2 and the optical beam profiles along the phase or X-axis of FIG. 2 are taken into account. Effects of the resulting intensity envelope modulation upon the interference pattern derived phase measurement can be minimized by proper optical design or apodization correction, as has been shown by applicants in the apparatus of FIG. 2.

Returning now to FIG. 2, the exemplary detector array 33 is shown as being comprised of a set of three detectors along the phase or X-axis and N sets of phase detectors disposed along the orthogonal frequency or Y-axis. For ease of understanding, each detector is identified by "D" followed by two digits, with "D" representing a detector and the following two numbers respectively representing the frequency row along the Y-axis in which the detector is located and the relative column position within that row along the phase or X-axis. For example, D31 represent a detector in the third row along the Y-axis and in the first column in that row along the X-axis.

The amplitude-detected outputs from each group of three detectors in a row along each frequency channel number in which a signal frequency has been detected are applied to an associated phase extraction processor 35 (FIG. 2A) in phase extraction processors 37 to determine the phase difference between the two RF inputs ($RF_0$ and $RF_1$) being applied to the Bragg Cells 27 and 29 at a particular channel frequency. To understand how a phase difference is determined by a phase extraction processor 35 FIG. 2A will now be discussed.

The amplitude outputs from three intensity-sensitive detectors in a given frequency row along the frequency or Y-axis are applied to the phase extraction processor 35 to determine the phase difference $\Delta\phi$ between the $RF_0$ and $RF_1$ inputs at the frequency of the given frequency row. The required mathematical equations that are utilized by the phase extraction processor 35 for electrical phase measurement extraction are provided as follows:

$$D1 = E_M^2 + E_R^2 + 2E_M E_R \sin(\phi_M - \phi_R)$$

$$D2 = E_M^2 + E_R^2 + 2E_M E_R \cos(\phi_M - \phi_R)$$

$$D3 = E_M^2 + E_R^2 - 2E_M E_R \sin(\phi_M - \phi_R)$$

where:

$E_M$=Electric field strength of measured signal, $E_R$=Electric field strength of reference signal, $\phi_M$=Electric phase of measured signal, $\phi_R$=Electric phase of reference signal, and D1, D2, D3=a Measured signal energy (or power) from detector D1, D2, D3 (FIG. 3).

Thus, $$2 \cdot (E_M^2 + E_R^2) = D1 + D3$$

$$\Delta\phi = \tan^{-1}\{[D1 - (E_M^2 + E_R^2)]/D2 - (E_M^2 + E_R^2)\}$$

This simplifies to:

$$\Delta\phi = \tan^{-1}\{(D1 - D3)/(2 \cdot D2 - D1 - D3)\}$$

where:

$\Delta\phi \equiv \phi_M - \phi_R$.

The above-discussed required mathematical equations for phase measurement extraction apply generally for all input signal amplitudes, and therefore model the relative phase measurement process independent of signal field strength (or amplitude).

Figure 5:
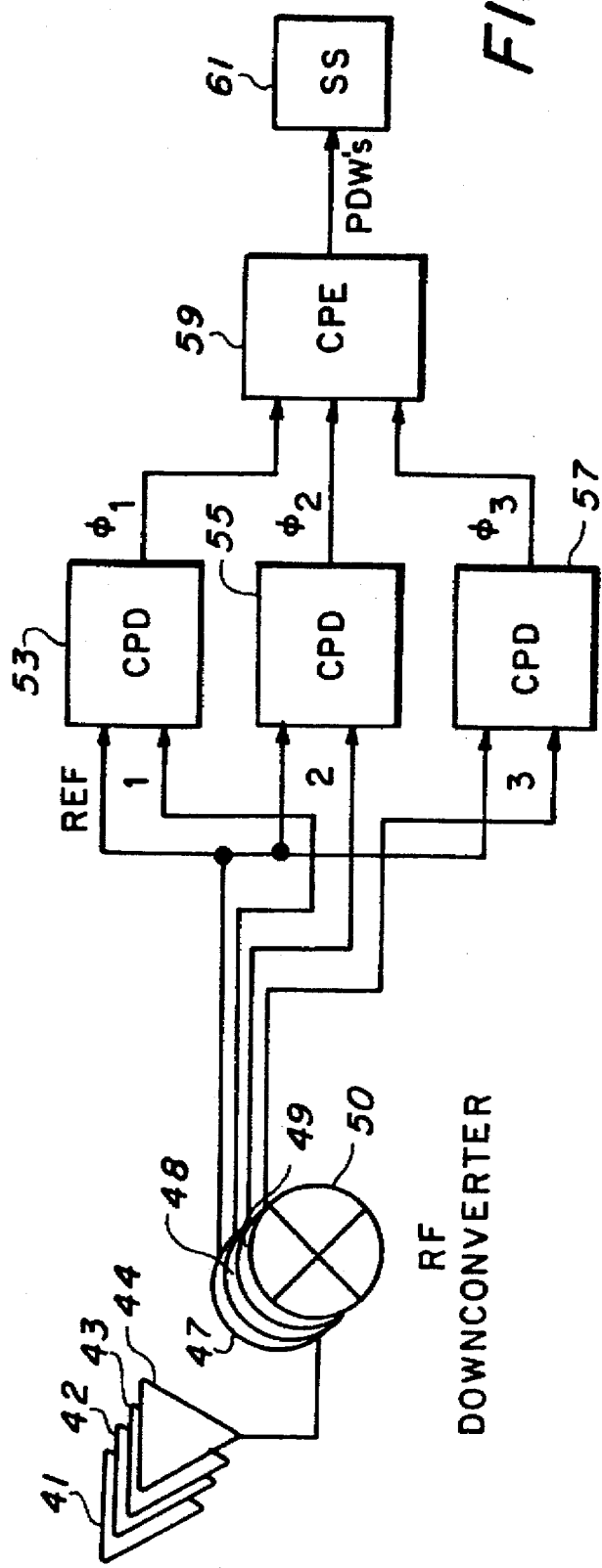
FIG. 5 illustrates a schematic block diagram of the multiple parallel phase measurement apparatus of the invention in a passive direction finding receiver application.

FIG. 5 illustrates a schematic block diagram of the multiple parallel phase measurement apparatus of the invention in a passive direction finding (DF) receiver application. This is a channelized RF interferometer utilizing, for example, four antenna elements 41–44 in a sparsely populated antenna array, such as a phased array antenna.

RF signals from the antenna elements 41–44 are respectively downconverted by converters 47–50 to a common intermediate frequency (IF) appropriate for subsequent processing, with relative phase maintained in the process. Three CPD modules 53, 55 and 57 are utilized in the system of FIG. 5, with each of the CPD modules 53, 55 and 57 being similar in structure and operation to the CPD of FIG. 2. Hence, no further description of the CPDs is needed.

The CPDs 53, 55 and 57 are required to extract the three corresponding phase differences on a frequency channelized basis, as was done for the one frequency channel in FIG. 2. Each CPD module output provides multiple phase measurements, one for each frequency bin or channel. In actuality, RF signal environment activity in conjunction with receiver performance parameters determine how many output channels will contain valid measurements.

Data from the three CPD modules are processed on a frequency channel-by-channel basis by a channelizer processing electronics (CPE) unit 59 to extract measurement parameters of interest, typically RF frequency, Angle of Arrival (AOA), and Time of Arrival. The CPE 59 implements the required parameter extraction algorithms and formats measurement data into a pulse descriptor word (PDW) stream for transmission to a signal sorter (SS) 61. The signal sorter processes blocks of PDWs to resolve individual RF emitters and correlates measured data with an internal database of known emitter parametrics to identify the signal source if possible.

A mathematical explanation of the operation of a typical CPE can be found in APPENDIX H, entitled "Subroutine for the Maximum Likelihood Method of Ambiguity Resolution", can be found in NRL Report 6603, entitled "Ambiguity Resolution in the SPASUR Radio Interference Direction Finding System", by Frank A. Polkinghorn, Jr., and Herbert Farnham, dated Oct. 12, 1967 of the Naval Research Laboratory, Washington, D.C. This NRL Report 6603 is incorporated by reference into this application.

Figure 6:
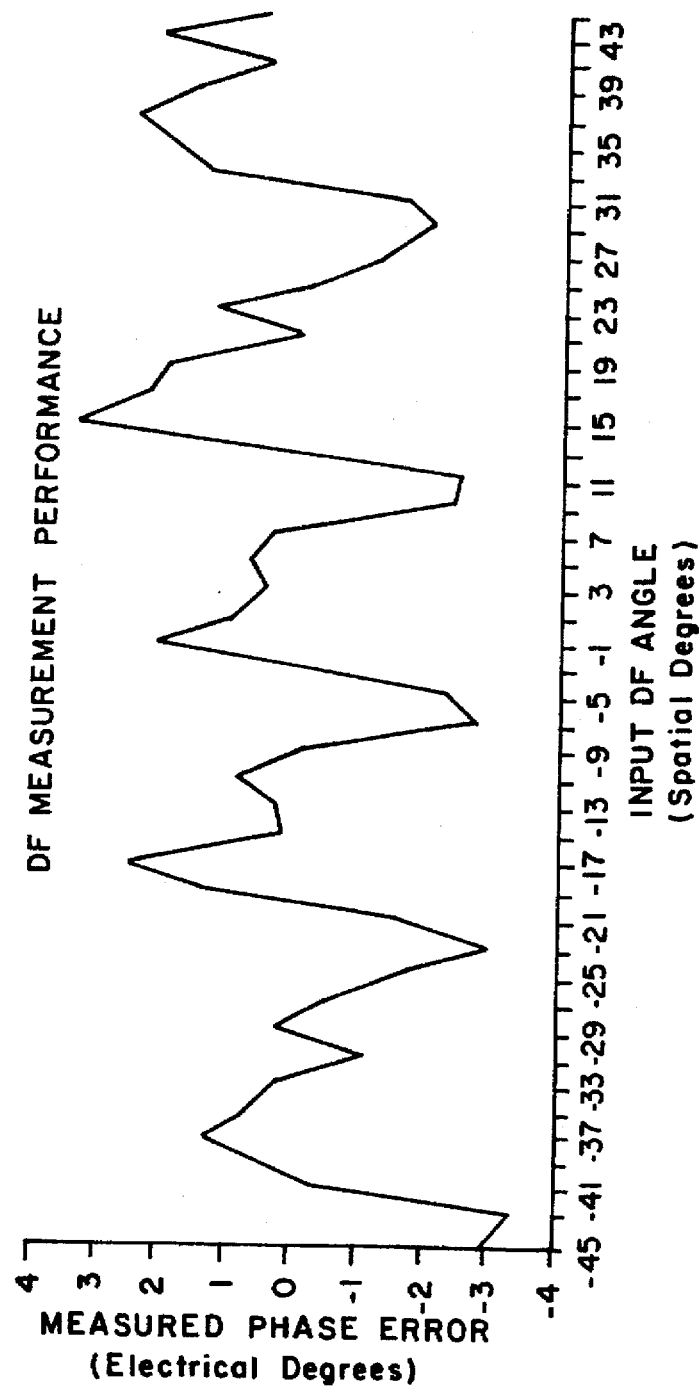
FIG. 6 shows phase measurement performance of the exemplary apparatus of FIG. 2 to a single input RF signal applied.

FIG. 6 shows the experimentally measured phase accuracy of the system of FIG. 2 to a single Rf channel input pair, provided by a phase modulated RF source having less than 3.0 degrees peak error.

FIG. 6 just shows an electrical phase error. Along the Y or vertical axis is the electrical phase error, given a particular simulated direction of arrival of an RF signal input. The applied electrical phase difference (X-axis) has been translated to an equivalent spatial angle of arrival. So a radar signal or a signal of interest at a particular angle of arrival can be simulated. Then, by examination it can be determined: the correctness of the phase that should occur, the $\Delta\phi$ in the above-discussed equation, and what it should be and how much in error it is in degrees. This shows that phase can be measured very accurately—within a few degrees.

ADVANTAGES AND NEW FEATURES OF THE INVENTION

Phase measurement by spatial sampling is desirable in multi-channel applications because of its simplified implementation and inherently parallel operation. Spatial sampling on a per channel basis, requires measurement of three detector output levels (voltage for instance) followed by application of a simple measurement algorithm to extract relative carrier phase.

Use of three detection elements serves to minimize the required number of sampling elements and maximize overall signal energy utilization. Fewer detection elements per frequency channel result in a higher speed, and a less complex (and hence more compact) implementation of the apparatus.

Spatial intensity modulation along the detector array phase axis affords simultaneous recovery of relative signal amplitude and phase, and removal of the intensity offset during a single sample time.

Incoherent or coherent detection is possible using the Multiple Parallel Spatial Phase Measurement approach. Incoherent or power detection simplifies subsequent signal processing hardware requirements, operating at relatively narrow video bandwidth. In contrast, typical coherent signal processing requires relatively complex processing hardware per channel to operate at intermediate frequencies (IF), but potentially has a larger dynamic range.

Presently available phase detector devices are single frequency devices designed to operate accurately over a narrow input signal dynamic range. Injection of multiple coincident signals into existing devices requires a separate phase detector-resolver device for each frequency channel.

ALTERNATIVES

The Multiple Parallel Spatial Phase measurement approach is not limited to RF input signals, nor is the modulation of a common optical carrier as in the preferred embodiment a requirement. Input signals may be sound, heat, light, electrical voltage, or any measurable quantity which may be modulated onto the common carrier at multiple frequency offsets. Although an optical carrier was used in the preferred embodiment, the common carrier may also be represented in other forms (ie radio waves) or frequency spectral ranges as well. Thus, for example, RF applications may utilize microwave or millimeterwave bands, or optical applications operating at infrared or ultraviolet wavelengths.

The means to separate the input RF bandwidth into separate operational frequency channels (for instance acoustic-optic Bragg cell channelization in the preferred embodiment of FIG. 2) does not prescribe any particular component or approach as long as input signal phase is preserved in the channelization process.

Modulation of a common carrier by input signal phase at each frequency channel may be accomplished by any modulation means, the acousto-optic Bragg Cell of the preferred embodiment is an especially effective means of simultaneous phase and frequency modulation.

Although the detector array implied a single device containing all elements, this is not a requirement. The detector readout method was not specified and as such may be fully parallel, fully serial, serial-parallel, or queued with respect to some activity detection mechanism for example, which does not alter the disclosed approach.

Three detector elements per frequency channel are considered the minimum necessary for measurement of relative signal phase using the method of spatial phase sampling described herein. The approach is not limited to quantity three elements however, any number of detector elements may be used for reasons of efficiency or otherwise. Also detector elements: need not be located on sequential spatial phase quadrants, need not have "exact" ninety degree spacing, and elements need not have sensing region widths of ninety degrees; for the approach to function adequately.

The disclosed approach is applicable to both incoherent (video output) or coherent (IF output) signal processing methods. Specific applications may dictate which processing method is preferable.

The physical configuration of the disclosed apparatus is non-specific, the means to generate a two-signal spatial interference pattern on the detector at each frequency channel is non-specific as well.

Therefore, what has been described in a preferred embodiment of the invention is a multiple, parallel, spatial phase measurement signal processing apparatus for providing accurate electrical phase difference measurement of multiple signal inputs concurrently. In operation, measurement and reference wideband RF inputs, differing primarily in phase over frequency, are respectively applied to two RF Channelizer components. Each Channelizer separates the composite input bandwidth into multiple time-coincident frequency output channels. Corresponding pairs of output channels then phase-modulate a common independent carrier which propagates to the detection plane of a photodetector array forming a spatial interference pattern along one axis for each frequency channel number. A preferred detector element scaling relative to the interference pattern affords efficient phase difference measurement incorporating three intensity-sensing detector elements at each frequency channel. Conversion of the resulting amplitudes from the preferred three detector elements to relative signal phase is accomplished with an algorithm. Phase measurement of an individual signal input is accomplished utilizing an efficient spatial sampling scheme.

It should therefore readily be understood that many modifications and variations of the present invention are possible within the purview of the claimed invention. It is therefore to be understood that, within the scope of the appended claims, the invention may be practiced otherwise than as specifically described.

What is claimed and desired to be secured by Letters Patent of the United States is:

1. A signal processing apparatus for providing concurrent electrical phase difference measurements of multiple signal inputs, said signal processing apparatus comprising:

a first channelizer circuit responsive to a first multiple signal containing individual signals independent of each other in frequency, phase and electrical amplitude for separating the first multiple signal into first multiple time-concurrent frequency channel signals;

a second channelizer circuit responsive to a second multiple signal containing individual signals independent of each other in frequency, phase and electrical amplitude for separating the second multiple signal into second multiple time-concurrent frequency channel signals, wherein corresponding individual signals of each of said first and second multiple signals have the same frequency and are received on the signal processing apparatus with different phases;

collimated coherent signal source means for developing first and second coherent signals;

first and second pluralities of phase modulators for respectively modulating the first and second coherent signals with the frequency and phase of the individual signals in the respective first and second multiple signals, the modulated first and second coherent signals interfering spatially to produce an intensity interference pattern along a phase axis and at a position along an orthogonal frequency axis corresponding to the frequencies of the frequency channel signals;

a detector array comprised of a set of at least three detectors disposed along the phase axis and N sets of said at least three detectors disposed along the orthogonal frequency axis, said detector array being responsive to said intensity interference pattern for developing amplitude signals; and an associated phase extraction processor coupled to each set of said at least three detectors along said phase axis and being responsive to amplitude signals from an associated set of said at least three detectors in said detector array for developing a phase difference between a corresponding pair of individual signals applied to said first and second channelizer circuits.

2. The signal processing apparatus of claim 1 wherein:

each said set of said at least three detectors disposed along the phase axis is comprised of three detectors separated in pitch by a distance corresponding to a span of substantially ninety degrees of the interference pattern period.

3. The signal processing apparatus of claim 1 wherein:

each said set of said at least three detectors disposed along the phase axis is comprised of three detectors separated in pitch by a distance corresponding to a span of substantially ninety degrees and any additional multiple of distance corresponding to 360 degrees of the interference pattern period.

4. A signal processing apparatus comprising:

a first channelizer circuit responsive to a first signal at a first frequency and having a first phase and a first electrical amplitude for separating the first signal into an associated one of a first plurality of frequency channels;

a second channelizer circuit responsive to a second signal at said first frequency and having a second phase and a second electrical amplitude for separating the second signal into an associated one of a second plurality of frequency channels corresponding to the associated one of said first plurality of frequency channels;

collimated coherent signal source means for developing first and second coherent signals;

first and second pluralities of modulators for respectively modulating the first and second coherent signals with the phase and amplitude of the respective first and second signals, the modulated first and second signals interfering spatially to produce an intensity interference pattern along a phase axis and at a position along an orthogonal frequency axis corresponding to the first frequency of the first and second pluralities of frequency channels;

a detector array with a set of at least three detectors disposed along the phase axis and N sets of said at least three detectors disposed along the orthogonal frequency axis, said detector array being responsive to said intensity interference pattern for developing amplitude signals; and an associated phase extraction processor coupled to each said set of said at least three detectors along said phase axis being responsive to amplitude signals from an associated set of said at least three detectors at said first frequency along the frequency axis in said detector array for developing a phase difference between the corresponding first and second signals applied to said first and second channelizer circuits.

5. The signal processing apparatus of claim 4 wherein:

each said set of said at least three detectors disposed along the phase axis is comprised of three detectors separated in pitch by a distance corresponding to a span of substantially ninety degrees of the interference pattern period.

6. The signal processing apparatus of claim 4 wherein:

each said set of said at least three detectors disposed along the phase axis is comprised of three detectors separated in pitch by a distance corresponding to a span of substantially ninety degrees and any additional multiple of distance corresponding to 360 degrees of the interference pattern period.

7. A signal processing apparatus for providing concurrent electrical phase difference measurements of multiple signal inputs, said signal processing apparatus comprising:

a first channelizer circuit responsive to a first multiple signal containing individual signals independent of each other in frequency, phase and electrical amplitude for spatially separating the first multiple signal into first multiple time-concurrent frequency channel signals;

a second channelizer circuit responsive to a second multiple signal containing individual signals independent of each other in frequency, phase and electrical amplitude for spatially separating the second multiple signal into second multiple time-concurrent frequency channel signals, wherein corresponding individual signals of each of said first and second multiple signals have the same frequency and are received at different locations on the signal processing apparatus with different phases;

coherent light means for developing first and second optical beams to respectively illuminate said first and second channelizer circuits and cause said first and second channelizer circuits to respectively modulate the first and second optical beams with the frequency and phase of the individual signals in the respective first and second multiple signals, the modulated first and second optical beams interfering spatially to produce an intensity interference pattern along a phase axis and deflected along an orthogonal frequency axis approximately proportional to the frequencies of the frequency channel signals;

a detector array comprised of a set of at least three detectors disposed along the phase axis and N sets of at least three detectors disposed along the orthogonal frequency axis, said detector array being responsive to said intensity interference pattern for developing amplitude signals; and means for performing a Fourier-transform on the interference pattern and imaging the Fourier-transformed interference pattern onto said detector array to cause the phase interference to occur along the phase axis of said detector array and a radio frequency signal Fourier transform to appear in the orthogonal frequency axis; and an associated phase extraction processor coupled to each set of said at least three detectors along said phase axis and being responsive to amplitude signals from an associated set of said at least three detectors in said detector array for developing a phase difference between a corresponding pair of individual signals applied to said first and second channelizer circuits.

8. The signal processing apparatus of claim 7 wherein:
each said set of said at least three detectors disposed along the phase axis is comprised of three detectors separated in pitch by a distance corresponding to a span of substantially ninety degrees of the interference pattern period.

9. The signal processing apparatus of claim 7 wherein:
each said set of said at least three detectors disposed along the phase axis is comprised of three detectors separated in pitch by a distance corresponding to a span of substantially ninety degrees and any additional multiple of distance corresponding to 360 degrees of the interference pattern period.

10. The signal processing apparatus of claim 7 wherein:
said coherent light means is a laser.

11. The signal processing apparatus of claim 7 wherein said coherent light means comprises:
a source of coherent light; and
means for splitting the coherent light into said first and second optical beams.

12. The signal processing apparatus of claim 11 wherein:
said source of coherent light is a laser; and
said splitting means is a beam splitter.

13. The signal processing apparatus of claim 7 wherein:
said performing means is a Fourier transform lens.

14. The signal processing apparatus of claim 7 wherein:
said first and second channelizer circuits are respectively first and second Bragg cells.

15. The signal processing apparatus of claim 12 wherein:
said first and second channelizer circuits are respectively first and second Bragg cells; and
said performing means is a Fourier transform lens.

16. A signal processing apparatus comprising:
a first channelizer circuit responsive to a first signal at a first frequency and having a first phase and a first electrical amplitude for spatially separating the first signal into an associated one of a first plurality of frequency channels;

a second channelizer circuit responsive to a second signal at said first frequency and having a second phase and a second electrical amplitude for spatially separating the second signal into an associated one of a second plurality of frequency channels corresponding to the associated one of said first plurality of frequency channels;

coherent light means for developing first and second optical beams to respectively illuminate said first and second channelizer circuits and cause said first and second channelizer circuits to respectively modulate the first and second optical beams with the frequency and phase of the respective first and second signals, the modulated first and second optical beams interfering spatially to produce an intensity interference pattern along a phase axis and deflected along an orthogonal frequency axis approximately proportional to the first frequency of the first and second pluralities of frequency channels;

a detector array comprised of a set of at least three detectors disposed along the phase axis and N sets of said at least three detectors disposed along the orthogonal frequency axis, said detector array being responsive to said intensity interference pattern for developing amplitude signals; and means for performing a Fourier-transform on the intensity interference pattern and imaging the Fourier-transformed intensity interference pattern onto said detector array to cause the phase interference to occur along the phase axis of said detector array and a radio frequency signal Fourier transform to appear in the orthogonal frequency axis; and an associated phase extraction processor coupled to each set of said at least three detectors along said phase axis and being responsive to detected interference pattern intensity signals from an associated set of said at least three detectors at said first frequency along the frequency axis in said detector array for developing a phase difference between the corresponding first and second signals applied to said first and second channelizer circuits.

17. The signal processing apparatus of claim 16 wherein:
each said set of said at least three detectors disposed along the phase axis is comprised of three detectors separated in pitch by a distance corresponding to a span of substantially ninety degrees of the interference pattern period.

18. The signal processing apparatus of claim 16 wherein:
each said set of said at least three detectors disposed along the phase axis is comprised of three detectors separated in pitch by a distance corresponding to a span of substantially ninety degrees and any additional multiple of distance corresponding to 360 degrees of the interference pattern period.

19. The signal processing apparatus of claim 16 wherein:

said coherent light means is a laser.

20. The signal processing apparatus of claim 16 wherein said coherent light means comprises:

a source of coherent light; and means for splitting the coherent light into said first and second optical beams.

21. The signal processing apparatus of claim 20 wherein:

said source of coherent light is a laser; and said splitting means is a beam splitter.

22. The signal processing apparatus of claim 16 wherein:

said performing means is a Fourier transform lens.

23. The signal processing apparatus of claim 16 wherein:

said first and second channelizer circuits are respectively first and second Bragg cells.

24. The signal processing apparatus of claim 21 wherein:

said first and second channelizer circuits are respectively first and second Bragg cells; and said performing means is a Fourier transform lens.

* * * * *